US010461169B2

(12) United States Patent
Yeh et al.

(10) Patent No.: US 10,461,169 B2
(45) Date of Patent: Oct. 29, 2019

(54) SEMICONDUCTOR DEVICE STRUCTURE AND METHOD FOR FORMING THE SAME

(71) Applicant: Taiwan Semiconductor Manufacturing Co., Ltd., Hsinchu (TW)

(72) Inventors: Chi-Ruei Yeh, New Taipei (TW); Chih-Lin Wang, Hsinchu County (TW); Kang-Min Kuo, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/911,884

(22) Filed: Mar. 5, 2018

(65) Prior Publication Data

US 2018/0197969 A1 Jul. 12, 2018

Related U.S. Application Data

(62) Division of application No. 14/940,832, filed on Nov. 13, 2015, now Pat. No. 9,911,821.

(51) Int. Cl.
| | |
|---|---|
| *H01L 29/51* | (2006.01) |
| *H01L 21/02* | (2006.01) |
| *H01L 21/768* | (2006.01) |
| *H01L 29/40* | (2006.01) |
| *H01L 29/423* | (2006.01) |

(Continued)

(52) U.S. Cl.
CPC ...... *H01L 29/518* (2013.01); *H01L 21/02247* (2013.01); *H01L 21/02252* (2013.01); *H01L 21/02255* (2013.01); *H01L 21/76826* (2013.01); *H01L 21/76829* (2013.01); *H01L 21/76832* (2013.01); *H01L 21/76834* (2013.01); *H01L 29/401* (2013.01); *H01L 29/42364* (2013.01);

(Continued)

(58) Field of Classification Search
CPC ............... H01L 29/518; H01L 29/7848; H01L 21/76832; H01L 21/76826; H01L 29/66545; H01L 29/665; H01L 29/4966; H01L 21/76834; H01L 21/02247; H01L 29/45; H01L 29/401; H01L 21/02252; H01L 21/02255; H01L 29/78; H01L 29/42364; H01L 21/76829; H01L 21/76814; H01L 21/28518; H01L 21/76843; H01L 21/76831; H01L 21/76855; H01L 23/485
See application file for complete search history.

(56) References Cited

U.S. PATENT DOCUMENTS

| | | | |
|---|---|---|---|
| 6,071,826 A | 6/2000 | Cho et al. | |
| 6,627,502 B1 | 9/2003 | Cho et al. | |

(Continued)

FOREIGN PATENT DOCUMENTS

| | | |
|---|---|---|
| TW | 201304012 A | 1/2013 |
| TW | 201312655 A | 3/2013 |

*Primary Examiner* — Edward Chin
(74) *Attorney, Agent, or Firm* — Haynes and Boone, LLP

(57) ABSTRACT

A method for forming a semiconductor device structure is provided. The method includes forming a metal gate electrode structure and an insulating layer over the semiconductor substrate. The insulating layer surrounds the metal gate electrode structure. The method includes nitrifying a first top portion of the metal gate electrode structure to form a metal nitride layer over the metal gate electrode structure.

20 Claims, 19 Drawing Sheets

(51) Int. Cl.
  *H01L 29/45* (2006.01)
  *H01L 29/78* (2006.01)
  *H01L 29/49* (2006.01)
  *H01L 29/66* (2006.01)
  *H01L 21/285* (2006.01)
  *H01L 23/485* (2006.01)

(52) U.S. Cl.
  CPC .......... *H01L 29/45* (2013.01); *H01L 29/4966* (2013.01); *H01L 29/665* (2013.01); *H01L 29/66545* (2013.01); *H01L 29/78* (2013.01); *H01L 29/7848* (2013.01); *H01L 21/28518* (2013.01); *H01L 21/76814* (2013.01); *H01L 21/76831* (2013.01); *H01L 21/76843* (2013.01); *H01L 21/76855* (2013.01); *H01L 23/485* (2013.01)

(56) References Cited

U.S. PATENT DOCUMENTS

| | | |
|---|---|---|
| 7,160,811 B2 | 1/2007 | Chen et al. |
| 9,647,117 B2 | 5/2017 | Colinge et al. |
| 2003/0146458 A1 | 8/2003 | Horiuchi et al. |
| 2005/0151166 A1 | 7/2005 | Lin et al. |
| 2006/0110866 A1 | 5/2006 | Gan et al. |
| 2008/0203501 A1 | 8/2008 | Yamazaki et al. |
| 2012/0252209 A1 | 10/2012 | Kabe et al. |
| 2013/0056837 A1* | 3/2013 | Ng .................. H01L 21/823807 257/410 |
| 2015/0179797 A1* | 6/2015 | Yin .................. H01L 29/66636 257/192 |
| 2015/0221676 A1 | 8/2015 | Holt et al. |

\* cited by examiner

SEMICONDUCTOR DEVICE STRUCTURE AND METHOD FOR FORMING THE SAME

PRIORITY INFORMATION

The present application is a divisional application of U.S. patent application Ser. No. 14/940,832, filed Nov. 13, 2015, entitled "SEMICONDUCTOR DEVICE STRUCTURE AND METHOD FOR FORMING THE SAME", which is hereby incorporated by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
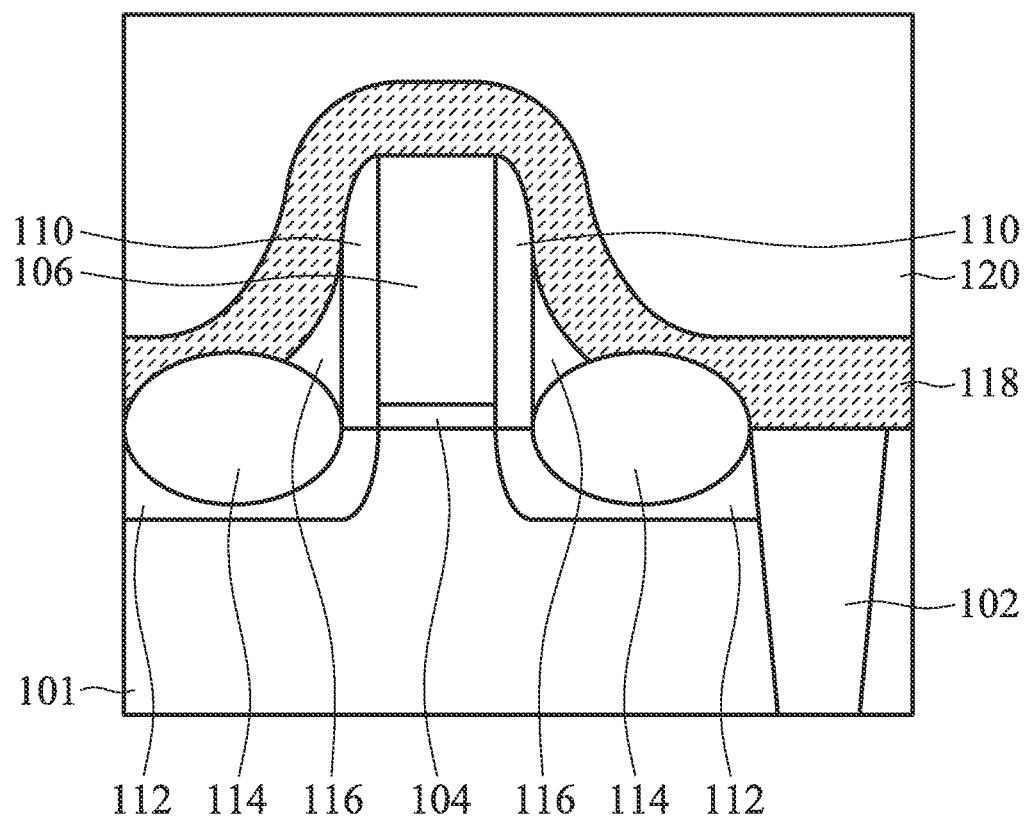
FIGS. 1A-1K are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1K are cross-sectional views of various stages of a process for forming a semiconductor device structure 100, in accordance with some embodiments. As shown in FIG. 1A, a semiconductor substrate 101 is provided. The semiconductor substrate 101 may be a semiconductor wafer (such as a silicon wafer) or a portion of a semiconductor wafer.

In some embodiments, the semiconductor substrate 101 is made of an elementary semiconductor material including silicon or germanium in a single crystal, polycrystal, or amorphous structure. In some other embodiments, the semiconductor substrate 101 is made of a compound semiconductor, such as silicon carbide, gallium arsenide, gallium phosphide, indium phosphide, indium arsenide, an alloy semiconductor, such as SiGe, or GaAsP, or a combination thereof. The semiconductor substrate 101 may also include multi-layer semiconductors, semiconductor on insulator (SOI) (such as silicon on insulator or germanium on insulator), or a combination thereof.

An isolation structure 102 is formed in the semiconductor substrate 101 to define various active regions in the semiconductor substrate 101, and to electrically isolate neighboring devices (e.g. transistors) from one another, in accordance with some embodiments. The isolation structure 102 includes a dielectric material, such as silicon oxide, silicon nitride, silicon oxynitride, fluoride-doped silicate glass (FSG), a low-K dielectric material, another suitable material, or a combination thereof, in accordance with some embodiments. The isolation structure 102 is formed by using an isolation technology, such as local oxidation of semiconductor (LOCOS), shallow trench isolation (STI), or the like, in accordance with some embodiments.

In some embodiments, the formation of the isolation structure 102 includes patterning the semiconductor substrate 101 by performing a photolithography process, etching a trench in the semiconductor substrate 101, and filling the trench with the dielectric material. In some embodiments, the filled trench has a multi-layer structure, such as a thermal oxide liner layer filled with silicon nitride or silicon oxide.

As shown in FIG. 1A, a gate dielectric layer 104 and a dummy gate 106 are formed over the semiconductor substrate 101 to define active regions in the semiconductor substrate 101, in accordance with some embodiments. In some embodiments, the gate dielectric layer 104 includes a high dielectric constant material (high-k material), in accordance with some embodiments. The high-k material includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or a combination thereof, in accordance with some embodiments.

The high-k material includes metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, another suitable material, or a combination thereof, in accordance with some embodiments. The dummy gate 106 is formed over the gate dielectric layer 104, in accordance with some embodiments. The dummy gate 106 is made of polysilicon or another suitable material, in accordance with some embodiments.

As shown in FIG. 1A, a spacer layer 110 is formed over sidewalls of the dummy gate 106 and the gate dielectric layer 104, in accordance with some embodiments. The spacer layer 110 includes a dielectric material, such as silicon nitride, silicon oxynitride, or a combination thereof, in accordance with some embodiments.

As shown in FIG. 1A, doped regions 112 are formed in the semiconductor substrate 101 and on opposite sides of the dummy gate 106, in accordance with some embodiments. The doped regions 112 are formed using an ion implantation process, in accordance with some embodiments. The doped regions 112 include a heavily doped source region and a heavily doped drain region, in accordance with some embodiments. The doped regions 112 are formed after the formation of the spacer layer 110, in accordance with some embodiments.

As shown in FIG. 1A, stressors 114 are formed in the doped regions 112, in accordance with some embodiments. The formation of the stressors 114 includes an etching process for removing a portion of the semiconductor substrate 101 and a selective epitaxial growth (SEG) process. Depending on the type of the resulting metal oxide semiconductor (MOS) device that is desired, either stressors applying a compressive stress to the channel region (such as SiGe stressors) or stressors applying a tensile stress to the channel region (such as SiC stressors) are formed, in accordance with some embodiments.

As shown in FIG. 1A, spacer oxide layers 116 are formed over the spacer layer 110 and the stressors 114, in accordance with some embodiments. The formation of the spacer oxide layers 116 includes a chemical vapor deposition process, in accordance with some embodiments. The spacer oxide layers 116 fill the gaps between the spacer layer 110 and the stressors 114 to facilitate films, which are subsequently formed, to cover the spacer layer 110 and the stressors 114 smoothly. In some other embodiments, the spacer oxide layers 116 are not formed.

As shown in FIG. 1A, a contact etch stop layer 118 is formed over the semiconductor substrate 101 and the dummy gate 106, in accordance with some embodiments. The contact etch stop layer 118 includes a dielectric material, such as silicon nitride, in accordance with some embodiments. The contact etch stop layer 118 is formed over the spacer layer 110, the dummy gate 106, and the semiconductor substrate 101, in accordance with some embodiments. In some other embodiments, the contact etch stop layer 118 is not formed.

As shown in FIG. 1A, an insulating layer 120 is deposited over the dummy gate 106 and the semiconductor substrate 101, in accordance with some embodiments. The insulating layer 120 includes an insulating material, in accordance with some embodiments. The insulating material includes silicon oxide, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The insulating layer 120 is formed using a CVD process, a HDPCVD process, a spin-on process, a sputtering process, or a combination thereof, in accordance with some embodiments.

Figure 1B:
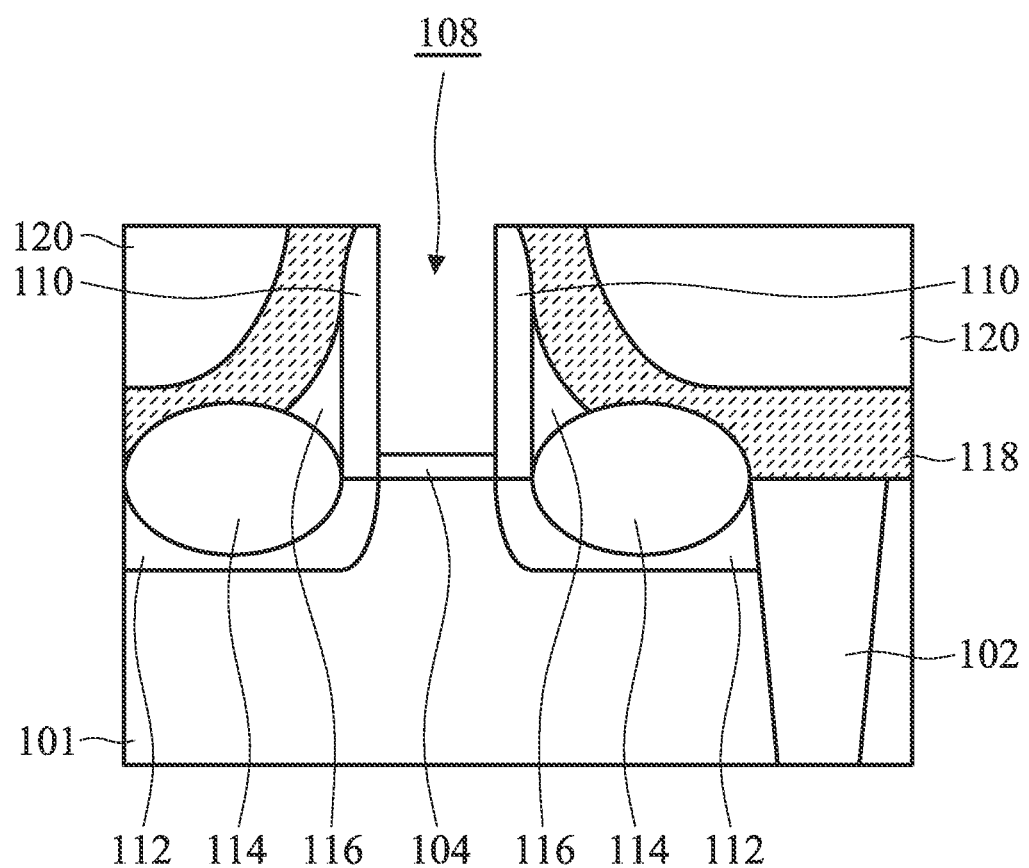

Afterwards, as shown in FIG. 1B, a planarization process is then performed to the insulating layer 120 until a top surface of the dummy gate 106 is exposed, in accordance with some embodiments. The planarization process includes a chemical mechanical polishing (CMP) process, in accordance with some embodiments. After the planarization process is performed, the insulating layer 120 has a substantially planar surface to facilitate subsequent process steps, in accordance with some embodiments.

Then, the dummy gate 106 is removed, in accordance with some embodiments. The removal process includes a wet etching process, a dry etching process, or a combination thereof, in accordance with some embodiments. After the dummy gate 106 is removed, an opening 108 is formed in the spacer layer 110, in accordance with some embodiments. The opening 108 is a trench, in accordance with some embodiments.

Figure 1C:
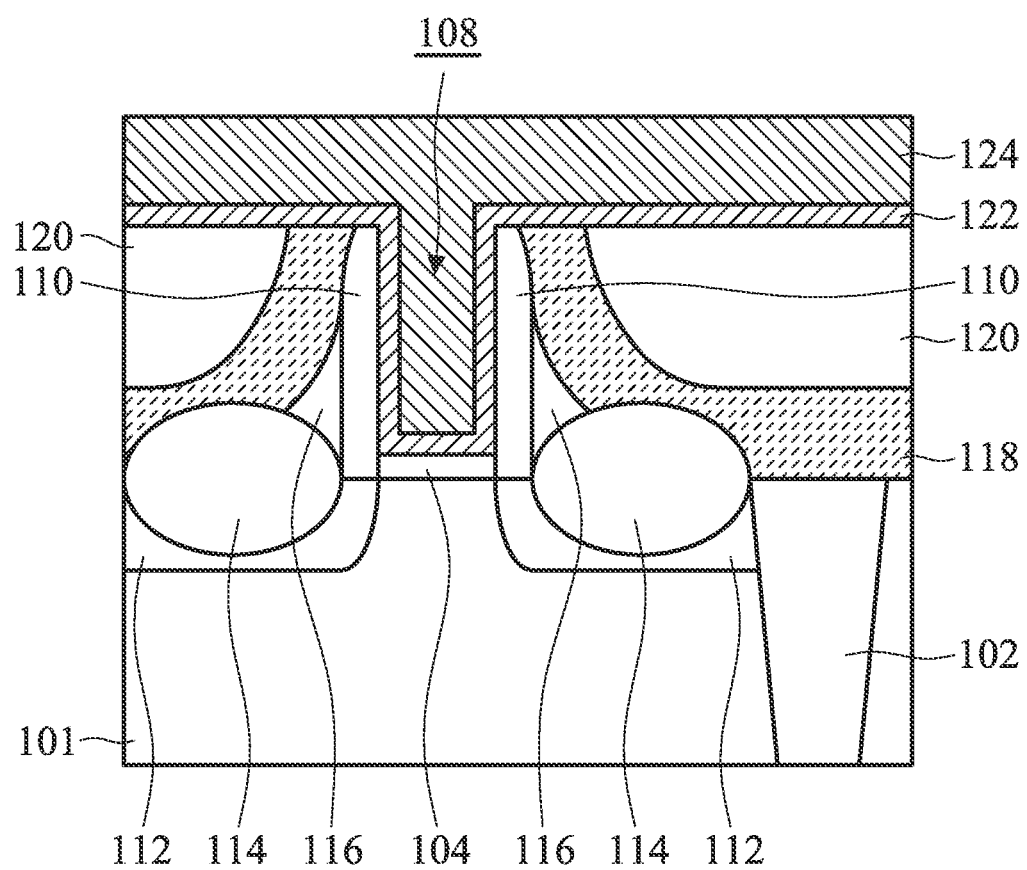

As shown in FIG. 1C, a work function metal layer 122 is deposited over the insulating layer 120 and the gate dielectric layer 104 in the opening 108, in accordance with some embodiments. The work function metal layer 122 provides a desired work function for transistors to enhance device performance including improved threshold voltage, in accordance with some embodiments.

In the embodiments of forming an NMOS transistor, the work function metal layer 122 can be an n-type metal capable of providing a work function value suitable for the device, such as equal to or less than about 4.5 eV. The n-type metal includes metal, metal carbide, metal nitride, or a combination thereof, in accordance with some embodiments. For example, the n-type metal is made of tantalum, tantalum nitride, or a combination thereof.

On the other hand, in the embodiments of forming a PMOS transistor, the work function metal layer 122 can be a p-type metal capable of providing a work function value suitable for the device, such as equal to or greater than about 4.8 eV. The p-type metal includes metal, metal carbide, metal nitride, another suitable material, or a combination thereof, in accordance with some embodiments. For example, the p-type metal is made of titanium, titanium nitride, another suitable material, or a combination thereof.

The work function metal layer 122 includes hafnium, zirconium, titanium, tantalum, aluminum, metal carbides, aluminides, ruthenium or a combination thereof, in accordance with some embodiments. The metal carbides include hafnium carbide or zirconium carbide, in accordance with some embodiments. The work function metal layer 122 is deposited by using a PVD process, CVD process, ALD process, plating process, another suitable method, or a combination thereof, in accordance with some embodiments.

As shown in FIG. 1C, a gate electrode layer 124 is deposited over the work function metal layer 122 to fill the opening 108, in accordance with some embodiments. The gate electrode layer 124 is also referred to as a metal gate electrode layer, in accordance with some embodiments. The gate electrode layer 124 includes a suitable metal material, such as aluminum, tungsten, gold, platinum, cobalt, other suitable metal, alloy thereof, or a combination thereof, in accordance with some embodiments. The gate electrode layer 124 is deposited by using a PVD process, a CVD process, a plating process, the like, or a combination thereof, in accordance with some embodiments.

Figure 1D:
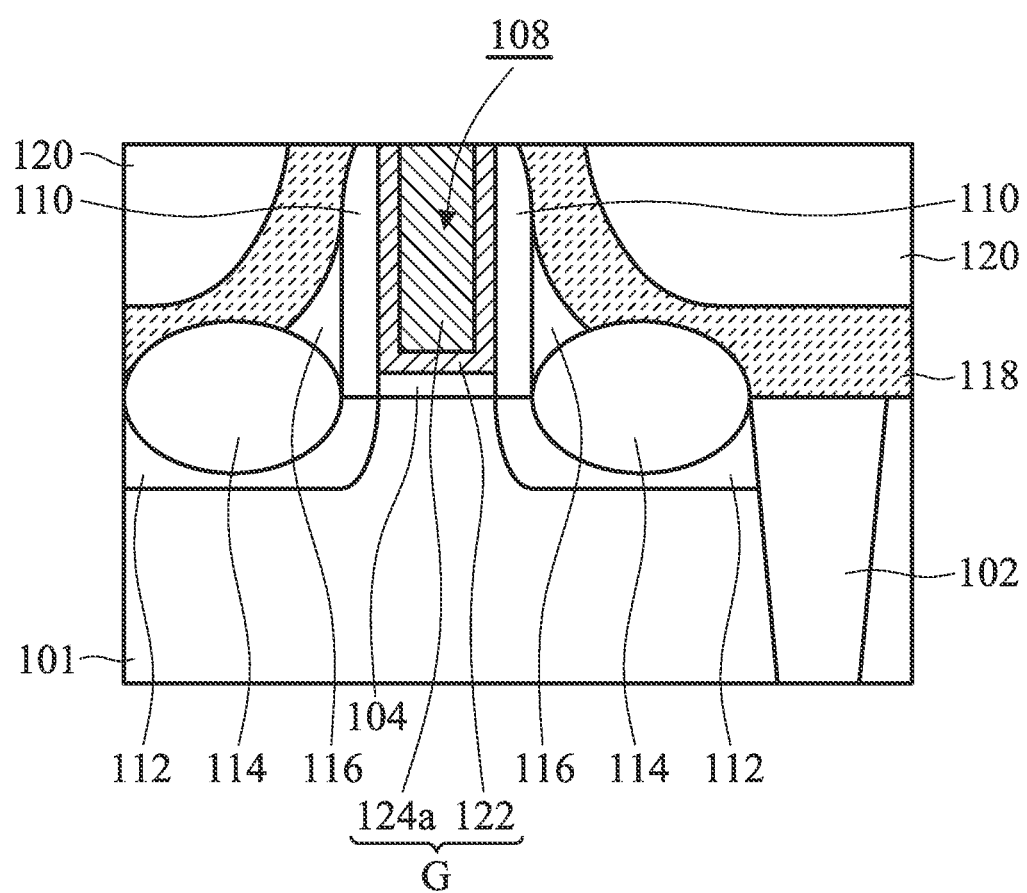

Afterwards, as shown in FIG. 1D, a planarization process is performed to remove the gate electrode layer 124 and the work function metal layer 122 outside of the opening 108, in accordance with some embodiments. The gate electrode layer 124 remaining in the opening 108 forms a gate electrode structure 124a, in accordance with some embodiments.

The gate electrode structure 124a and the work function metal layer 122 together form a gate stack G, in accordance with some embodiments. The gate stack G is also referred to as a metal gate stack, in accordance with some embodiments. The gate stack G is surrounded by the insulating layer 120, in accordance with some embodiments. After the planarization process, the gate stack G is aligned with the insulating layer 120, the contact etch stop layer 118, and the spacer layer 110, in accordance with some embodiments. The planarization process includes a chemical mechanical polishing (CMP) process or the like, in accordance with some embodiments.

Figure 1E:
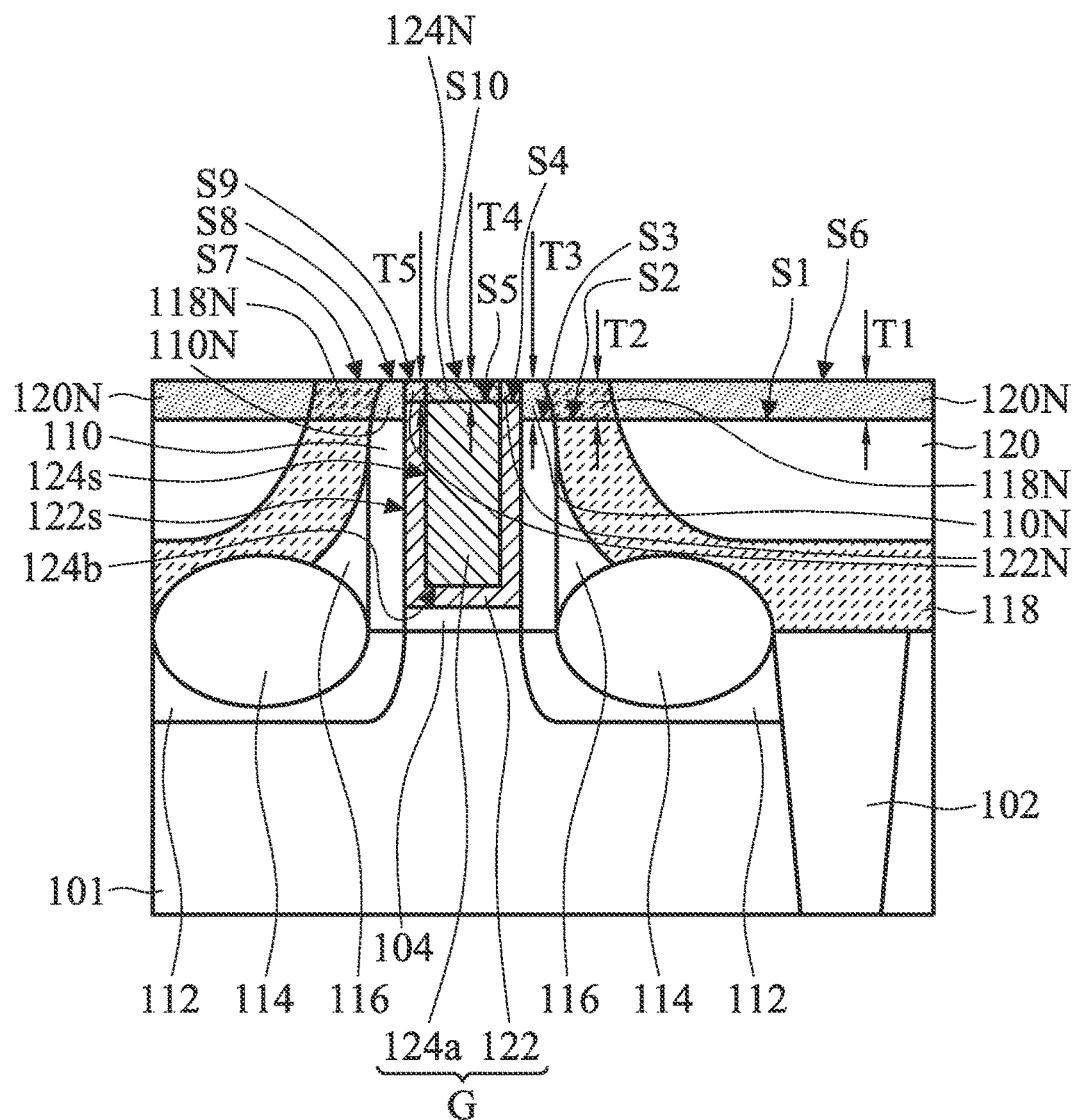

As shown in FIG. 1E, a nitrification process is performed on top portions of the insulating layer 120, the contact etch stop layer 118, the spacer layer 110, the work function metal layer 122, and the gate electrode structure 124a, in accordance with some embodiments. After the nitrification process, nitride layers 120N, 118N, and 110N, and metal nitride layers 122N and 124N are formed over top surfaces S1, S2, S3, S4, and S5 of the insulating layer 120, the contact etch stop layer 118, the spacer layer 110, the work function metal layer 122, and the gate electrode structure 124a, respectively, in accordance with some embodiments.

The nitride layers 120N, 118N, and 110N, and the metal nitride layers 122N and 124N are in direct contact with the insulating layer 120, the contact etch stop layer 118, the spacer layer 110, the work function metal layer 122, and the gate electrode structure 124a, respectively, in accordance with some embodiments. The nitride layers 120N, 118N, and 110N, and the metal nitride layers 122N and 124N are connected sequentially, in accordance with some embodiments. The work function metal layer 122 covers the sidewalls 124s and the bottom surface 124b of the gate electrode structure 124a, in accordance with some embodiments.

The metal nitride layers 122N and 124N and the nitride layers 110N, 118N, and 120N are formed from the work function metal layer 122, the gate electrode structure 124a, the spacer layer 110, the contact etch stop layer 118, and the insulating layer 120, respectively, in accordance with some embodiments. In some embodiments, the work function metal layer 122 includes a conductive material (e.g., tantalum), and the metal nitride layer 122N includes a nitride material of the conductive material (e.g., tantalum nitride).

In some embodiments, the gate electrode structure 124a includes a conductive material (e.g., aluminum, tungsten, gold, platinum, or cobalt), and the metal nitride layer 124N includes a nitride material of the conductive material (e.g., aluminum nitride, tungsten nitride, gold nitride, platinum nitride, or cobalt nitride). In some embodiments, the spacer layer 110 includes a dielectric material, and the nitride layer 110N includes a nitride material of the spacer layer 110.

In some embodiments, the contact etch stop layer 118 includes a dielectric material, and the nitride layer 118N includes a nitride material of the contact etch stop layer 118. In some embodiments, the insulating layer 120 includes a dielectric material (e.g., silicon oxide), and the nitride layer 120N includes a nitride material of the insulating layer 120 (e.g., silicon oxynitride).

The nitrification process includes performing a nitrogen plasma process or a nitrogen ion implantation process on the top portions of the insulating layer 120, the contact etch stop layer 118, the spacer layer 110, the work function metal layer 122, and the gate electrode structure 124a, in accordance with some embodiments. The power used in the nitrogen plasma process ranges from about 20 W to about 400 W, in accordance with some embodiments.

The nitrification process further includes performing a thermal process on the top portions of the insulating layer 120, the contact etch stop layer 118, the spacer layer 110, the work function metal layer 122, and the gate electrode structure 124a after the nitrogen plasma process or the nitrogen ion implantation process, in accordance with some embodiments. The process temperature of the thermal process ranges from about 200° C. to about 600° C., in accordance with some embodiments.

In some embodiments, a thickness T1 of the nitride layer 120N, a thickness T2 of the nitride layer 118N, or a thickness T3 of the nitride layer 110N is different from a thickness T4 of the metal nitride layer 124N or a thickness T5 of the metal nitride layer 122N. In some embodiments, the thickness T1 of the nitride layer 120N, the thickness T2 of the nitride layer 118N, or the thickness T3 of the nitride layer 110N is greater than the thickness T4 of the metal nitride layer 124N or the thickness T5 of the metal nitride layer 122N. The difference between the thickness T1, T2, or T3 and the thickness T4 or T5 ranges from about 1 Å to about 99 Å, in accordance with some embodiments.

The thickness T1, T2, T3, T4, or T5 ranges from about 1 Å to about 100 Å, in accordance with some embodiments. The thicknesses T1, T2, T3, T4, and T5 are adjustable by adjusting the process parameters of the nitrogen plasma process, the nitrogen ion implantation process, and/or the thermal process, in accordance with some embodiments.

Since the thickness T1, T2, or T3 is greater than the thickness T4 or T5, the nitride layer 120N, 118N, and/or 110N covers the sidewalls 124s and 122s of the gate electrode structure 124a and the work function metal layer 122, in accordance with some embodiments. In some embodiments, top surfaces S6, S7, S8, S9, and S10 of the nitride layers 120N, 118N, and 110N and the metal nitride layers 122N and 124N are aligned with each other. That is, the top surfaces S6, S7, S8, S9, and S10 are substantially coplanar with each other, in accordance with some embodiments.

Figure 1F:
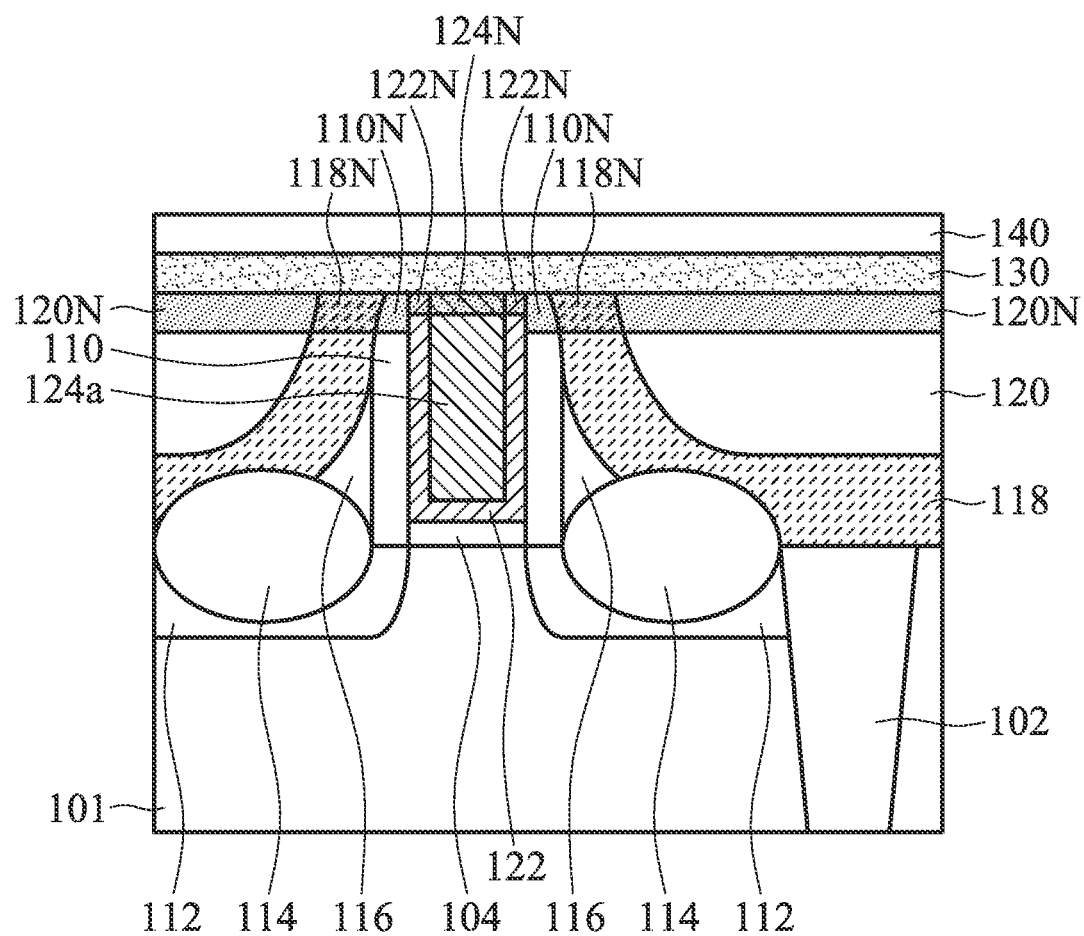

As shown in FIG. 1F, an etch stop layer 130 is deposited over the nitride layers 120N, 118N, and 110N and the metal nitride layers 122N and 124N, in accordance with some embodiments. In some embodiments, the etch stop layer 130 is in direct contact with the nitride layers 120N, 118N, and 110N and the metal nitride layers 122N and 124N. The etch stop layer 130 is made of silicon nitride or another suitable material, in accordance with some embodiments.

Since the nitride layer 120N is formed from the insulating layer 120, the adhesion between the nitride layer 120N and the insulating layer 120 is greater than the adhesion between the etch stop layer 130 and the insulating layer 120, in accordance with some embodiments. Since the nitride layer 120N and the etch stop layer 130 both include nitrogen, the adhesion between the nitride layer 120N and the etch stop layer 130 is greater than the adhesion between the insulating layer 120 and the etch stop layer 130, in accordance with some embodiments.

Similarly, the adhesion between the nitride layer 118N and the contact etch stop layer 118 is greater than the adhesion between the contact etch stop layer 118 and the etch stop layer 130, in accordance with some embodiments. The adhesion between the nitride layer 118N and the etch stop layer 130 is greater than the adhesion between the contact etch stop layer 118 and the etch stop layer 130, in accordance with some embodiments. The adhesion between the nitride layer 110N and the spacer layer 110 (or the etch stop layer 130) is greater than the adhesion between the spacer layer 110 and the etch stop layer 130, in accordance with some embodiments.

The adhesion between the metal nitride layer 122N and the work function metal layer 122 (or the etch stop layer 130) is greater than the adhesion between the work function metal layer 122 and the etch stop layer 130, in accordance with some embodiments. The adhesion between the metal nitride layer 124N and the gate electrode structure 124a (or the etch stop layer 130) is greater than the adhesion between the gate electrode structure 124a and the etch stop layer 130, in accordance with some embodiments.

Therefore, the nitride layers 120N, 118N, and 110N and the metal nitride layers 122N and 124N prevent delamination of the etch stop layer 130 from the insulating layer 120, the contact etch stop layer 118, the spacer layer 110, the work function metal layer 122, and the gate electrode structure 124a, in accordance with some embodiments.

Referring to FIG. 1F, a protective layer 140 is formed over the etch stop layer 130, in accordance with some embodiments. The protective layer 140 is configured to protect the etch stop layer 130 from being damaged during a subsequent pre-amorphized implantation (PAI) process, in accordance with some embodiments. The protective layer 140 includes, for example, a plasma-enhanced oxide (PEOX) layer.

Figure 1G:
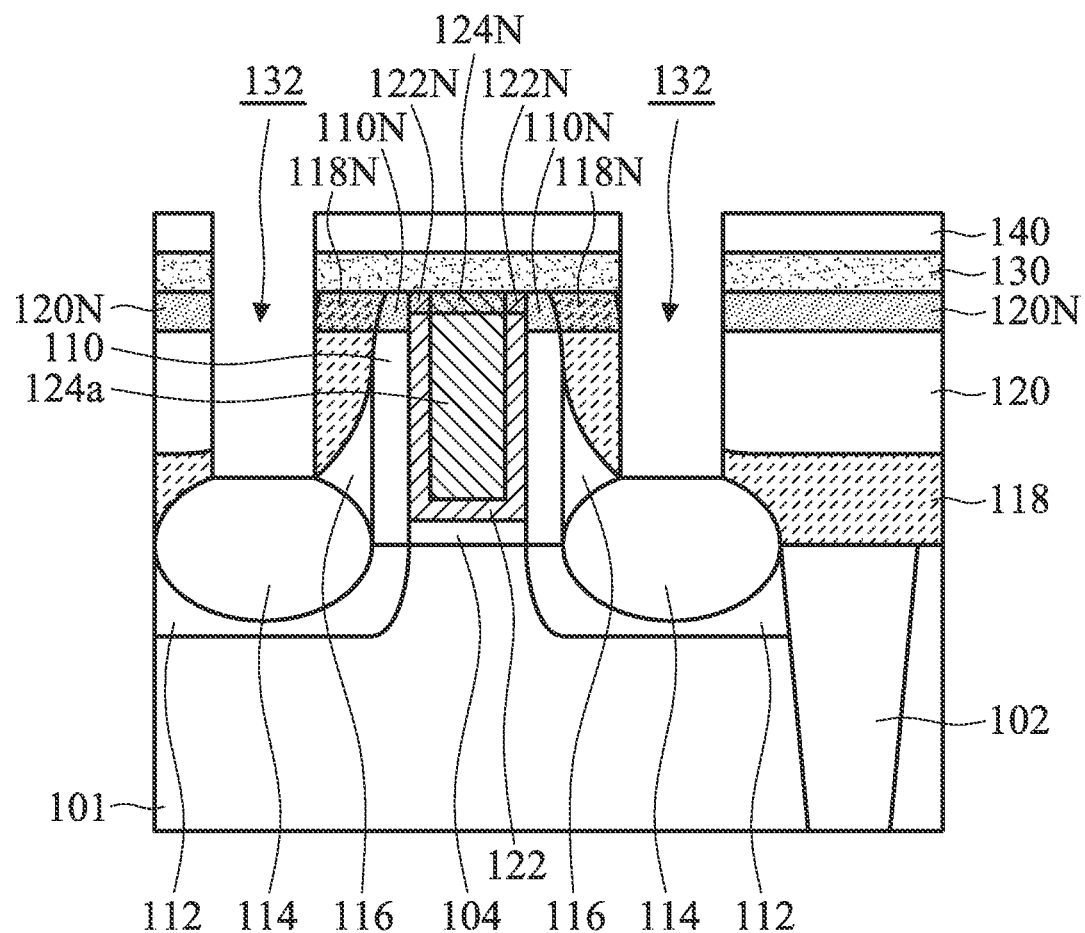

As shown in FIG. 1G, the protective layer 140, the etch stop layer 130, the nitride layer 120N, the insulating layer 120, and the contact etch stop layer 118 are patterned to form contact openings 132 exposing the respective stressors 114, in accordance with some embodiments. A photolithography process and an etching process are used for patterning, in accordance with some embodiments.

The nitride layers 120N, 118N, and 110N and the metal nitride layers 122N and 124N prevent delamination of the etch stop layer 130 from the layers 120, 118, 110, 122, and the gate electrode structure 124a, in accordance with some embodiments. Therefore, the nitride layers 120N, 118N, and 110N and the metal nitride layers 122N and 124N prevent the etchants of the etching process from diffusing to and damaging the gate electrode structure 124a, in accordance with some embodiments.

Figure 1H:
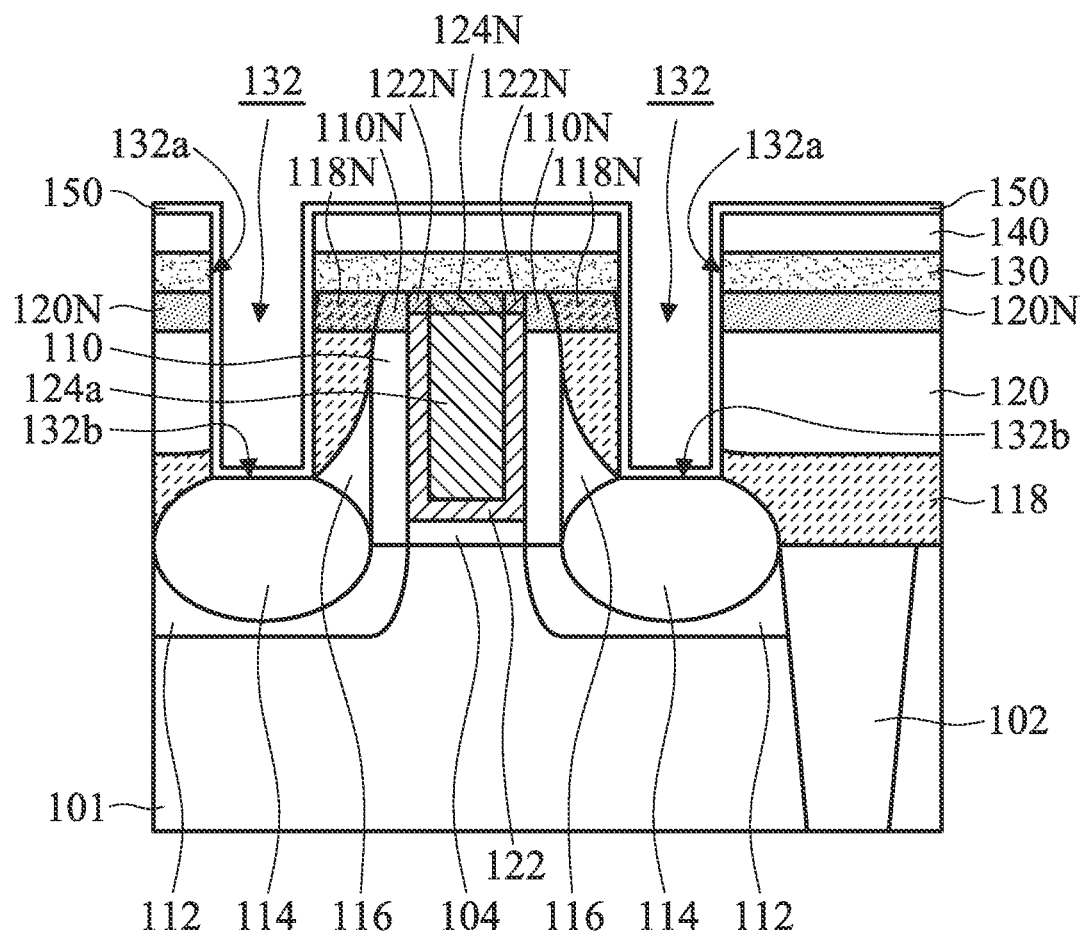

As shown in FIG. 1H, a dielectric spacer liner (DSL) layer 150 is conformally formed over the protective layer 140 and the sidewalls 132a and the bottom surfaces 132b of the contact openings 132, in accordance with some embodiments. The DSL layer 150 is configured to protect the sidewalls 132a from being damaged by the subsequent PAI process. The DSL layer 150 is made of, for example, SiOC or another suitable material. The DSL layer 150 is formed by, for example, an atomic layer deposition process or another suitable process. In some embodiments, the DSL layer 150 is in direct contact with the nitride layer 120N.

Figure 1I:
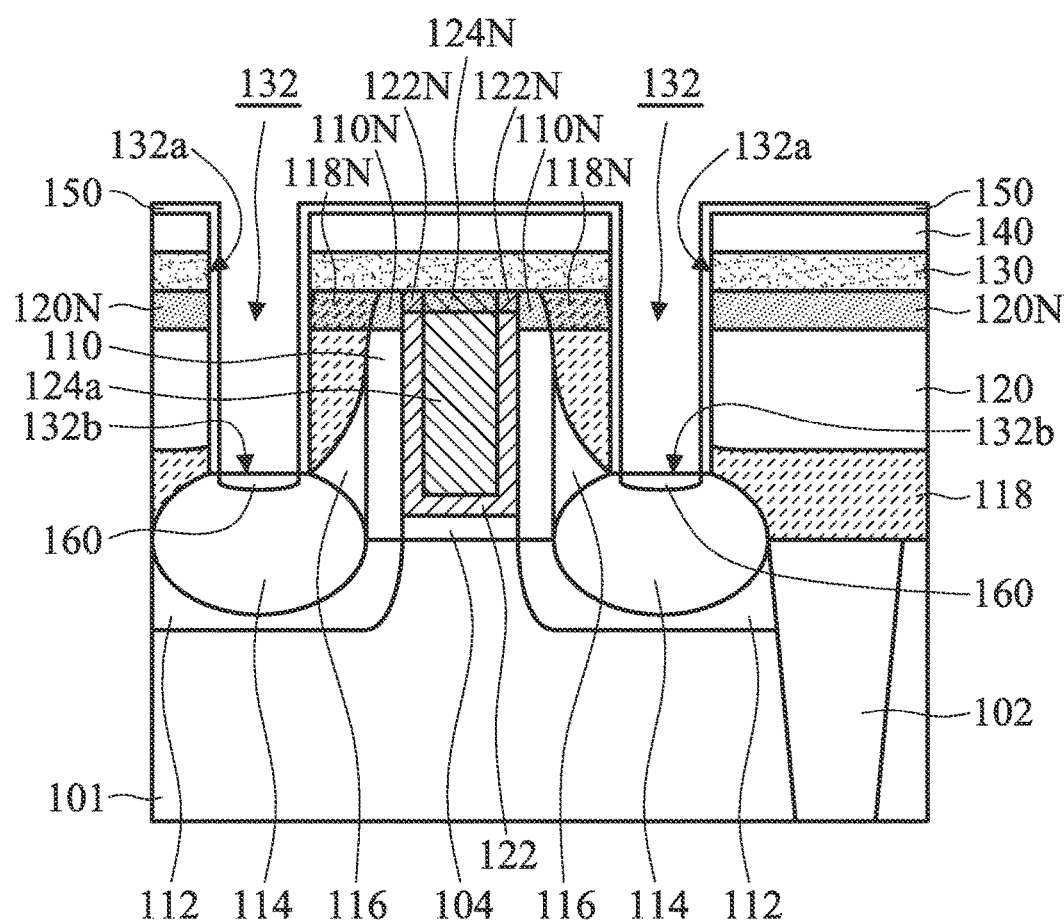

As shown in FIG. 1I, an etching process is performed to remove the DSL layer 150 over the bottom surfaces 132b of the openings 132 so as to expose portions of the stressors 114, in accordance with some embodiments. The etching process includes, for example, an argon plasma etching process.

Afterwards, a cleaning process is performed to clean the residues from the etching process of the DSL layer 150 over the bottom surfaces 132b, in accordance with some embodiments. The cleaning process uses a cleaning solution containing $NH_4OH$, $H_2O_2$, and $H_2O$, in accordance with some embodiments. The nitride layers 120N, 118N, and 110N and the metal nitride layers 122N and 124N prevent the cleaning solution from laterally diffusing to and damaging the gate electrode structure 124a and the work function metal layer 122, in accordance with some embodiments.

A pre-amorphized implantation (PAI) process is performed to reduce the dopant channeling effect and enhance dopant activation, in accordance with some embodiments. In some embodiments, silicon, germanium or carbon is used. In some other embodiments, inert gases, such as neon, argon, krypton, xenon, and/or radon, are used. The PAI process prevents subsequently doped impurities from channeling through spaces within the crystal lattice structure and reaching depths greater than desired, in accordance with some embodiments. Portions of the stressors 114, which are exposed by the openings 132, are turned into an amorphous state as a result of the PAI process, in accordance with some embodiments.

Thereafter, a salicidation process is performed to form metal silicide structures 160 on/in the stressors 114, in accordance with some embodiments. The metal silicide structures 160 include nickel silicide, in accordance with some embodiments. In some embodiments, the metal silicide structures 160 are made of a silicide material of a suitable metal material.

The suitable metal material includes cobalt (Co), nickel (Ni), platinum (Pt), titanium (Ti), ytterbium (Yb), molybdenum (Mo), erbium (Er), or a combination thereof, in accordance with some embodiments. The salicidation process includes depositing a metal film (not shown) over the stressors 114 and the DSL layer 150 and performing an annealing process to react the metal film with the stressors 114, in accordance with some embodiments. In some embodiments, the salicidation process is not performed.

Then, an un-reacted portion of the metal film is removed by using, for example, an etching process. The etching process includes a wet etching process, dry etching process, or a combination thereof, in accordance with some embodiments. In some embodiments, a wet etching process uses an etchant, such as hot phosphoric acid, to remove the un-reacted portion of the metal film. The nitride layers 120N, 118N, and 110N and the metal nitride layers 122N and 124N prevent the etchant from diffusing to and damaging the gate electrode structure 124a and the work function metal layer 122, in accordance with some embodiments.

Figure 1J:
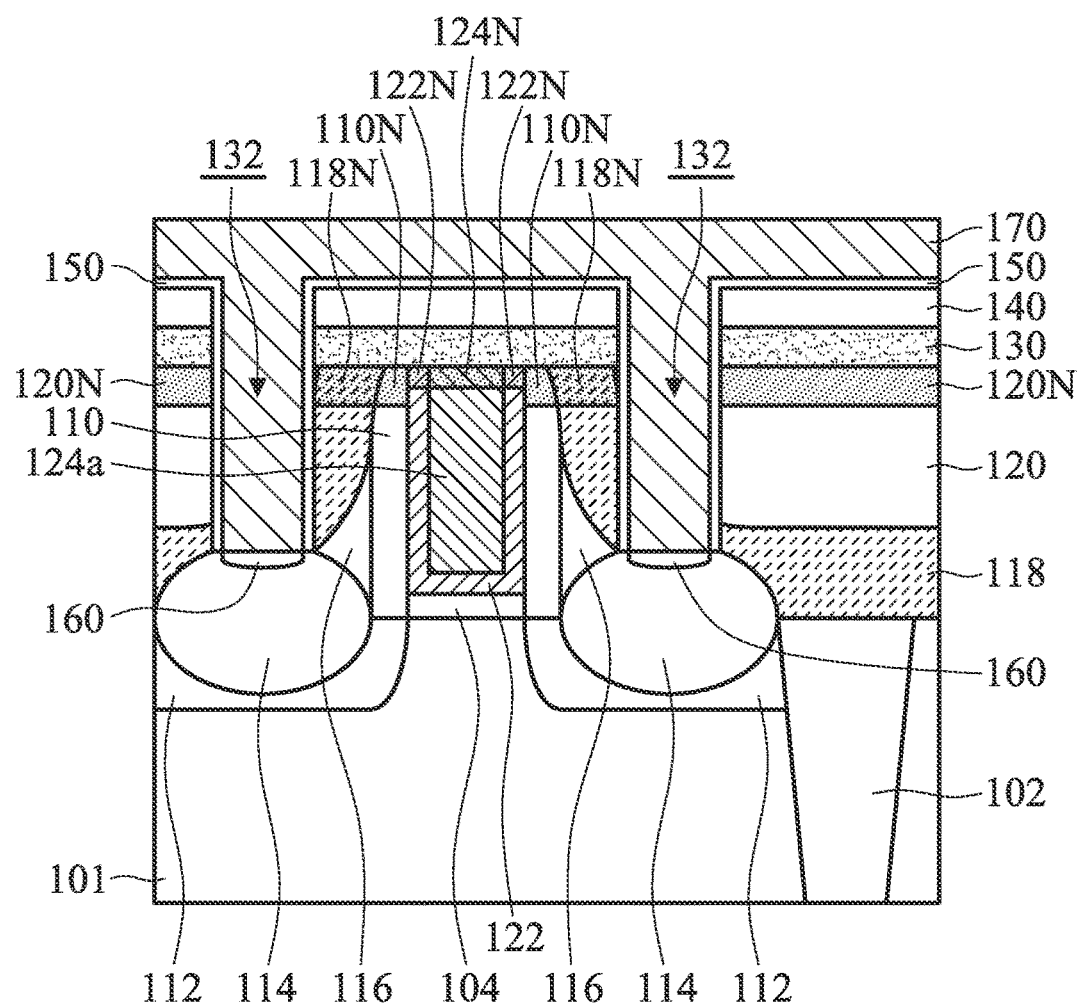

As shown in FIG. 1J, a conductive layer 170 is deposited over the stressors 114 and the DSL layer 150 and is filled into the openings 132 to be electrically connected to the metal silicide structures 160. The conductive layer 170 is formed by, for example, a PVD process or another suitable process. The conductive layer 170 is made of, for example, tungsten or another suitable conductive material.

Figure 1K:
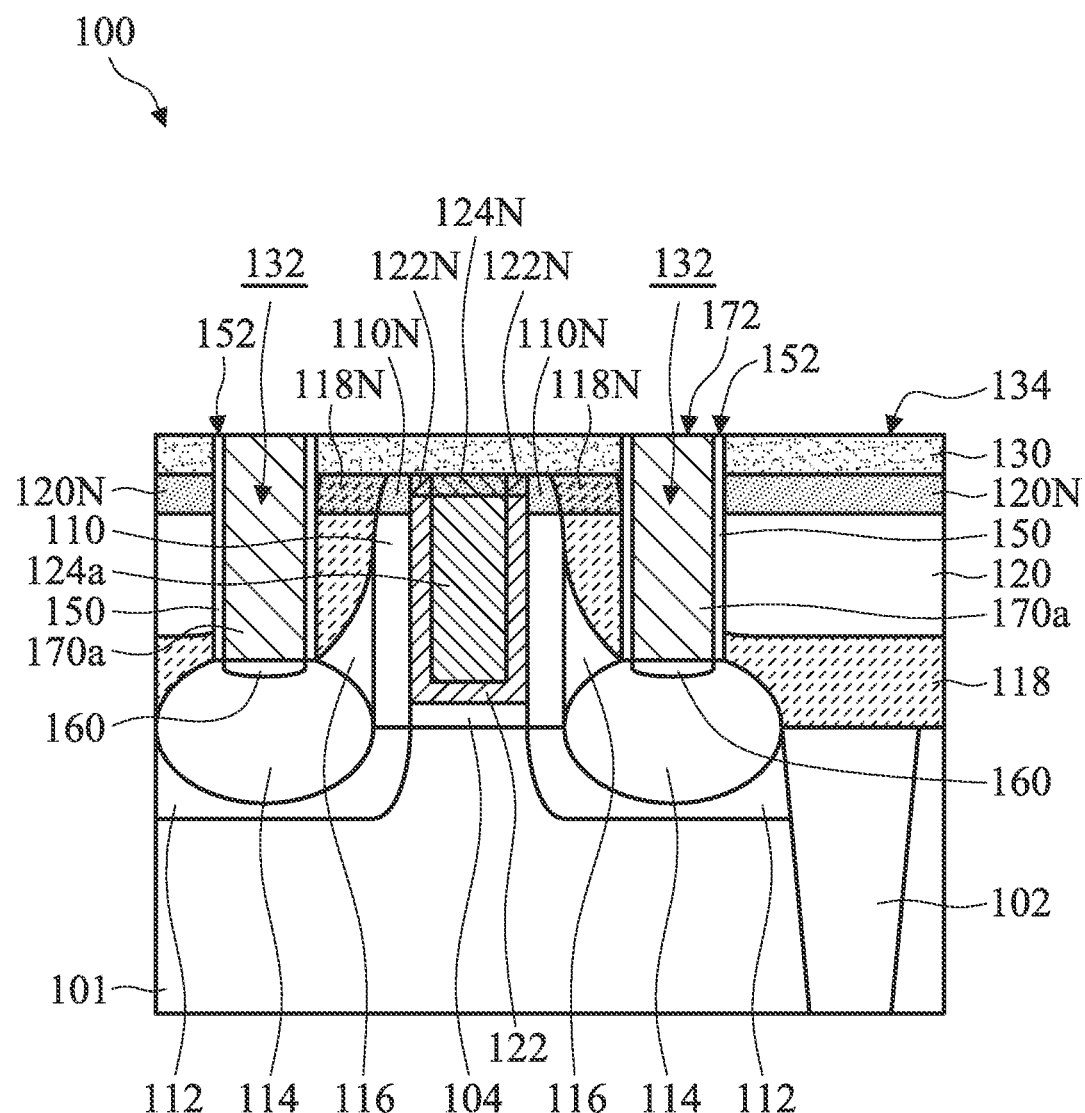

As shown in FIG. 1K, a chemical mechanical polishing (CMP) process is performed to remove the conductive layer 170 and the DSL layer 150 outside the openings 132, and the protective layer 140, in accordance with some embodiments. After the CMP process, the conductive layer 170 remaining in the openings 132 forms contact structures 170a, in accordance with some embodiments.

The contact structures 170a pass through the etch stop layer 130, the nitride layer 120N, the insulating layer 120, and the contact etch stop layer 118 to be electrically connected to the metal silicide structures 160 and the doped regions 112 (i.e. the S/D regions), in accordance with some embodiments. The contact structures 170a are also referred to as contact plugs, in accordance with some embodiments.

After the CMP process, top surfaces 172, 152 and 134 of the contact structures 170a, the DSL layer 150, and the etch stop layer 130 are coplanar with each other, in accordance with some embodiments. As shown in FIG. 1K, a semiconductor device structure 100 is substantially formed, in accordance with some embodiments. The semiconductor device structure 100 is an n-type metal-oxide-semiconductor field-effect transistor (MOSFET) or a p-type MOSFET, in accordance with some embodiments. The doped regions 112 are formed on opposite sides of the gate electrode structure 124a, in accordance with some embodiments.

Since the nitride layers 120N, 118N, and 110N and the metal nitride layers 122N and 124N prevent the etchant from diffusing to and damaging the gate electrode structure 124a and the work function metal layer 122, the yield of the semiconductor device structure 100 is improved, in accordance with some embodiments.

Figure 2A:
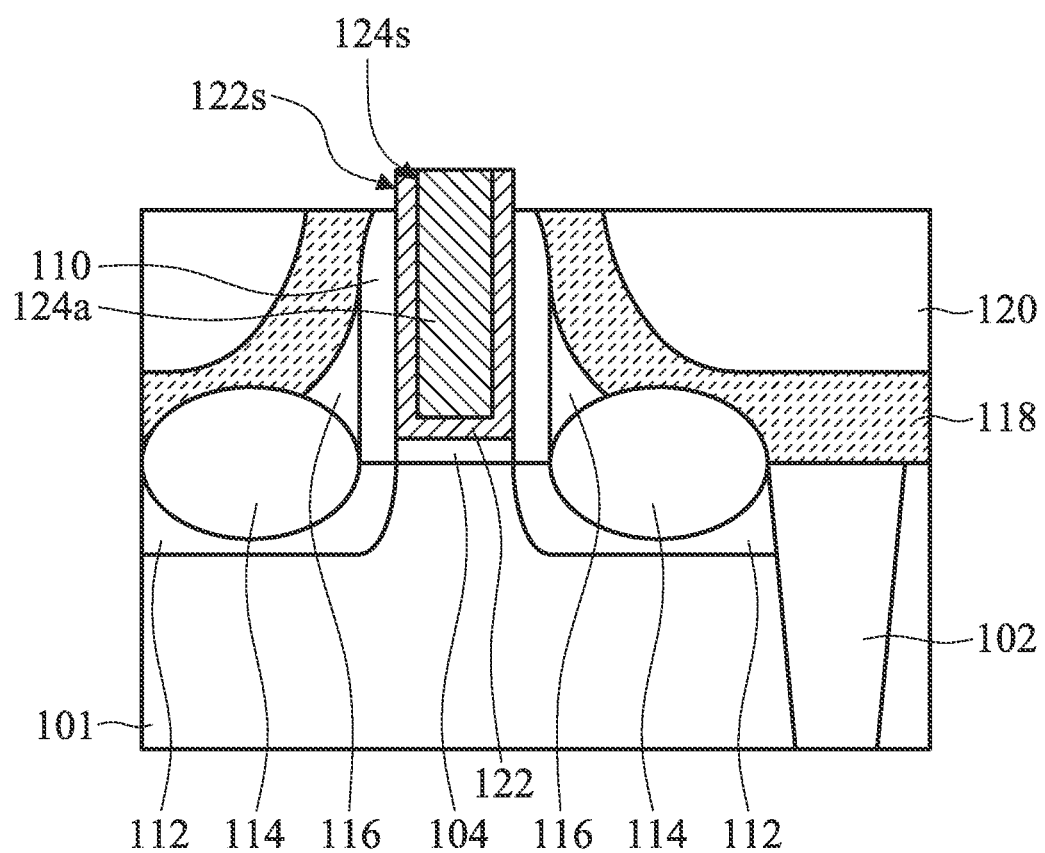
FIGS. 2A-2C are cross-sectional views of various stages of a process for forming a semiconductor device structure, in accordance with some embodiments.
Figure 2B:
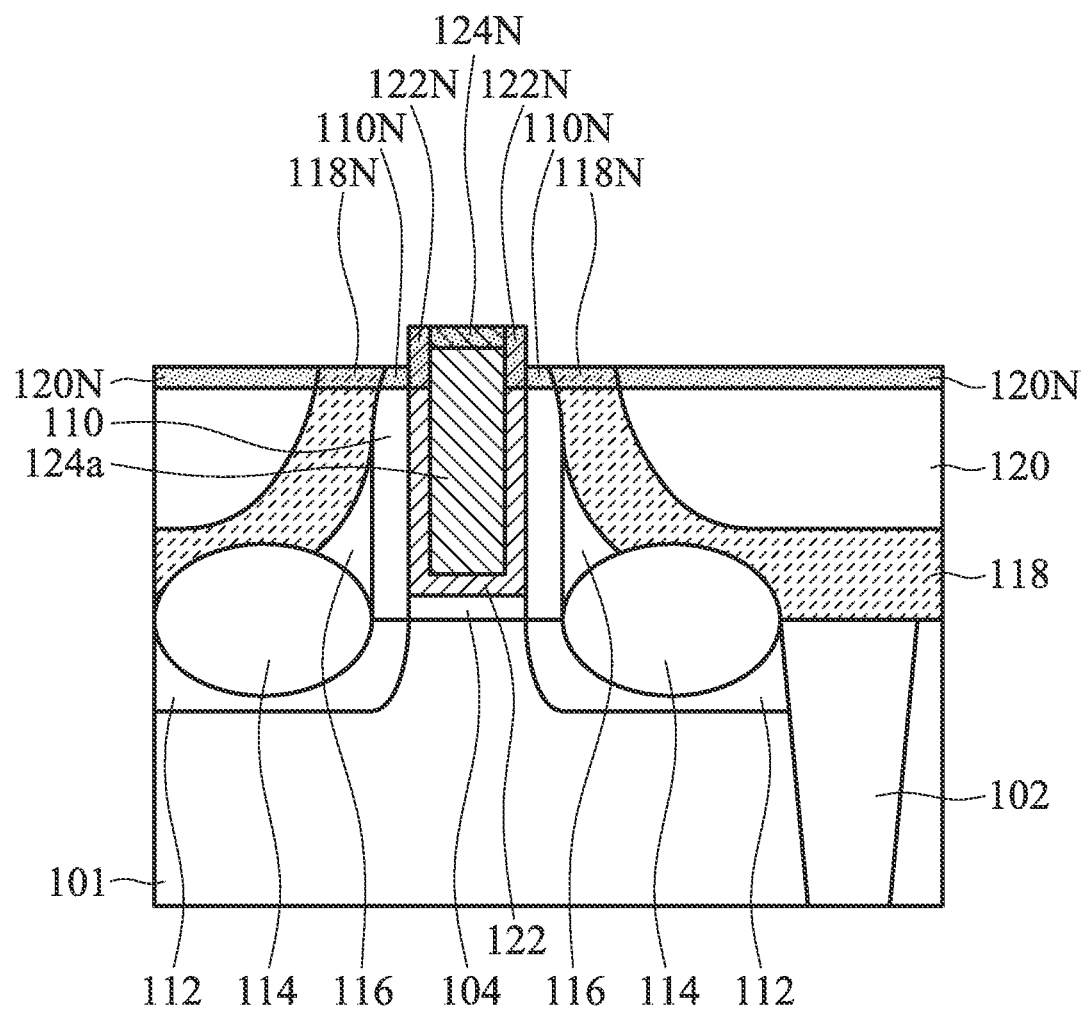
Figure 2C:
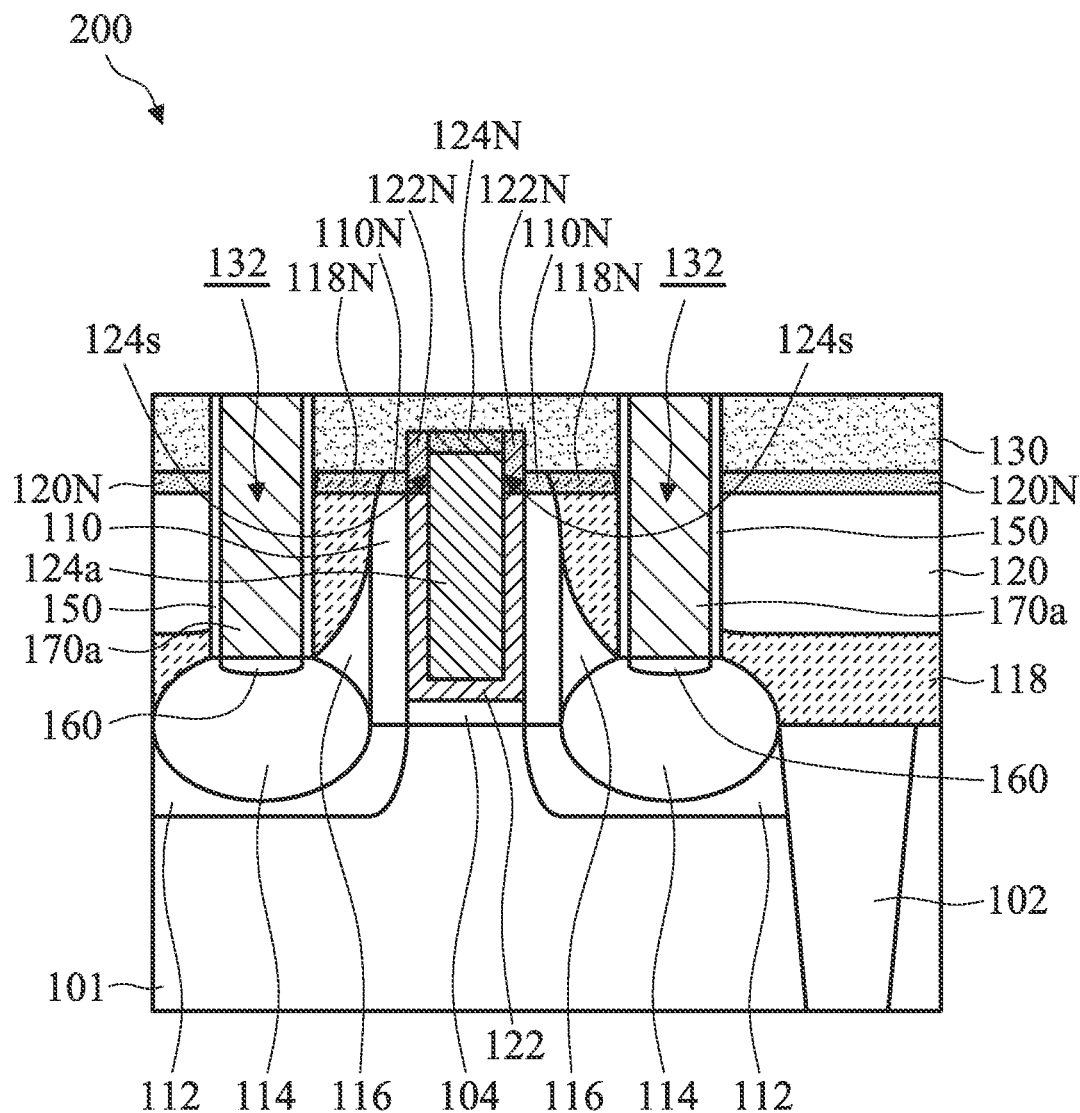

FIGS. 2A-2C are cross-sectional views of various stages of a process for forming a semiconductor device structure 200, in accordance with some embodiments. As shown in FIG. 2A, after the step of FIG. 1D, top portions of the insulating layer 120, the contact etch stop layer 118, and the spacer layer 110 are removed, in accordance with some embodiments. After the removal process, portions of the sidewalls 122s and 124s of the work function metal layer 122 and the gate electrode structure 124a are exposed by the insulating layer 120, the contact etch stop layer 118, and the spacer layer 110, in accordance with some embodiments.

As shown in FIG. 2B, a nitrification process is performed on top portions of the insulating layer 120, the contact etch stop layer 118, the spacer layer 110, the work function metal layer 122, and the gate electrode structure 124a, in accordance with some embodiments. After the nitrification process, metal nitride layers 122N and 124N and the nitride layers 110N, 118N, and 120N are formed over the work function metal layer 122, the gate electrode structure 124a, the spacer layer 110, the contact etch stop layer 118, and the insulating layer 120, respectively, in accordance with some embodiments.

The metal nitride layers 122N and 124N and the nitride layers 110N, 118N, and 120N are formed from the work function metal layer 122, the gate electrode structure 124a, the spacer layer 110, the contact etch stop layer 118, and the insulating layer 120, respectively, in accordance with some embodiments.

After the steps illustrated in FIGS. 1F-1K, as shown in FIG. 2C, a semiconductor device structure 200 is substantially formed, in accordance with some embodiments. The metal nitride layer 124N, a portion of the metal nitride layer 122N, and a portion of the gate electrode structure 124a are embedded in the etch stop layer 130, in accordance with some embodiments. The metal nitride layer 122N covers the sidewalls 124s of the gate electrode structure 124a, in accordance with some embodiments.

The nitride layers 120N, 118N, and 110N and the metal nitride layers 122N and 124N prevent the etchant from diffusing to and damaging the gate electrode structure 124a and the work function metal layer 122 during the formation of the contact openings 132, the contact structures 170a, and the DSL layer 150, in accordance with some embodiments. Therefore, the yield of the semiconductor device structure 200 is improved, in accordance with some embodiments.

Figure 3A:
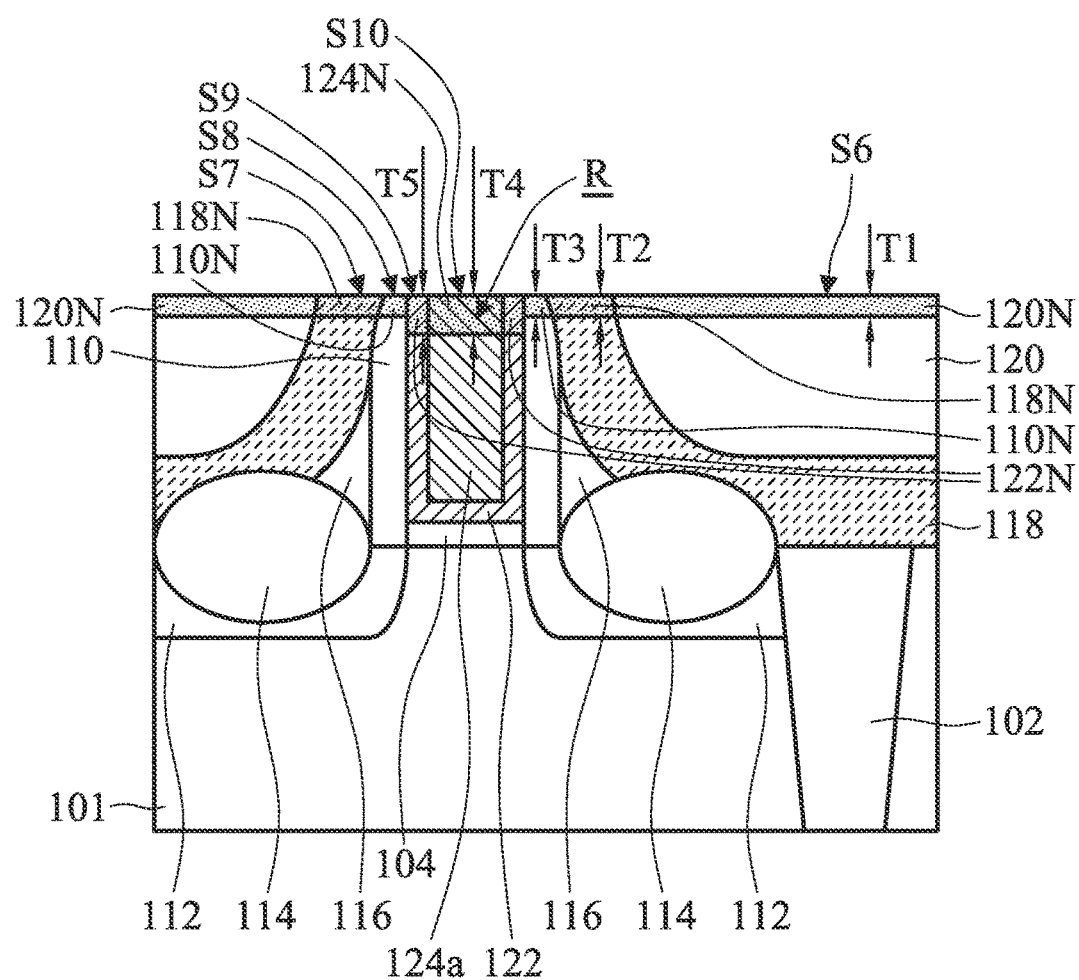
FIGS. 3A-3B are cross-sectional views of various stages of a process for forming a semiconductor device structure, in accordance with some embodiments.
Figure 3B:
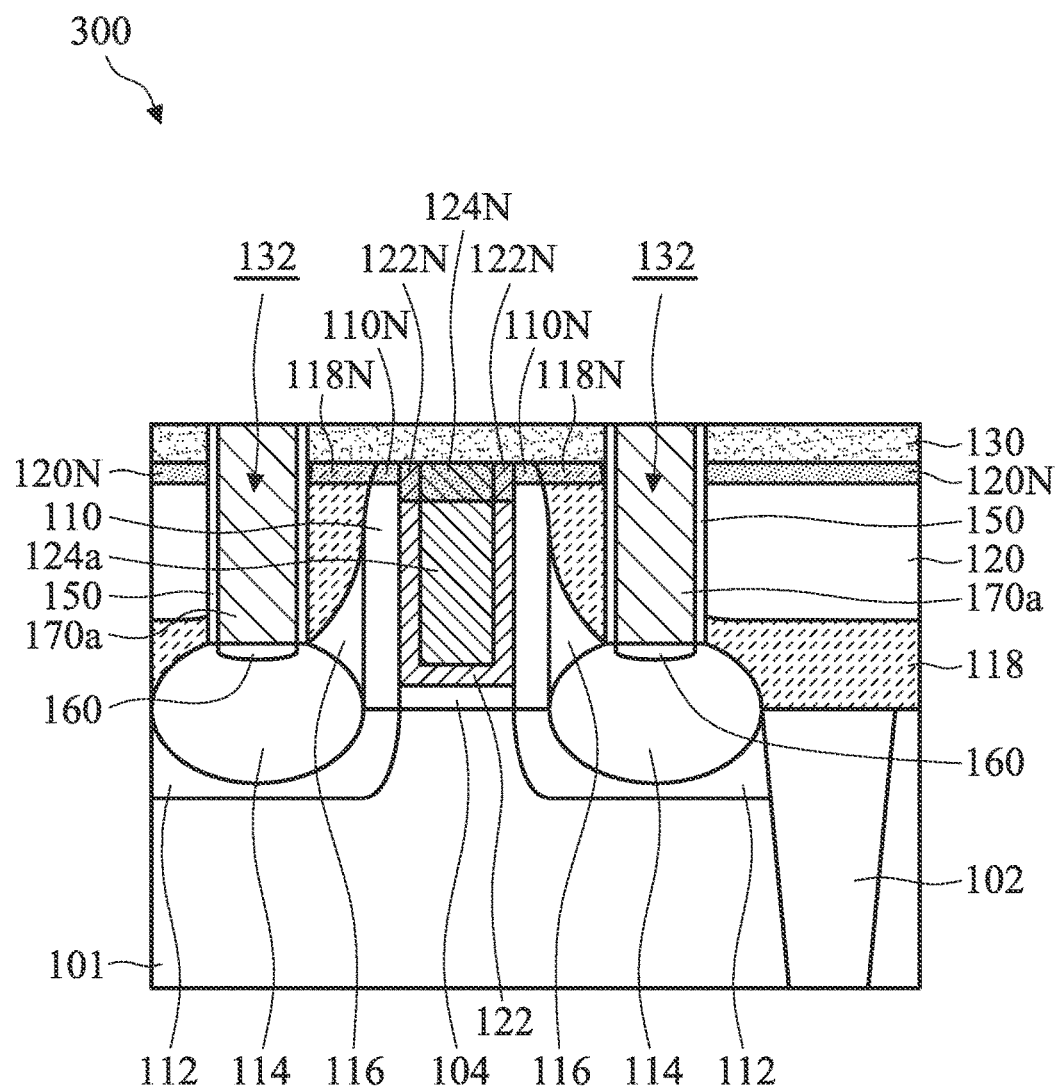

FIGS. 3A-3B are cross-sectional views of various stages of a process for forming a semiconductor device structure 300, in accordance with some embodiments. As shown in FIG. 3A, after the step of FIG. 1D, a nitrification process is performed on top portions of the insulating layer 120, the contact etch stop layer 118, the spacer layer 110, the work function metal layer 122, and the gate electrode structure 124a, in accordance with some embodiments.

After the nitrification process, metal nitride layers 122N and 124N and the nitride layers 110N, 118N, and 120N are formed over the work function metal layer 122, the gate electrode structure 124a, the spacer layer 110, the contact etch stop layer 118, and the insulating layer 120, respectively, in accordance with some embodiments.

The metal nitride layers 122N and 124N and the nitride layers 110N, 118N, and 120N are formed from the work function metal layer 122, the gate electrode structure 124a, the spacer layer 110, the contact etch stop layer 118, and the insulating layer 120, respectively, in accordance with some embodiments.

In some embodiments, a thickness T1 of the nitride layer 120N, a thickness T2 of the nitride layer 118N, or a thickness T3 of the nitride layer 110N is less than a thickness T4 of the metal nitride layer 124N or a thickness T5 of the metal nitride layer 122N. The thicknesses T1, T2, T3, T4, and T5 are adjustable by adjusting the process parameters of the nitrogen plasma process, the nitrogen ion implantation process, and/or the thermal process, in accordance with some embodiments.

In some embodiments, top surfaces S6, S7, S8, S9, and S10 of the nitride layers 120N, 118N, and 110N and the metal nitride layers 122N and 124N are aligned with each other. That is, the top surfaces S6, S7, S8, S9, and S10 are substantially coplanar with each other, in accordance with some embodiments. Since the thickness T1, T2, or T3 is less than the thickness T4 or T5, the metal nitride layers 122N and 124N extend into a recess R surrounded by the insulating layer 120 (or the spacer layer 110) and the gate electrode structure 124a, in accordance with some embodiments.

After the steps illustrated in FIGS. 1F-1K, as shown in FIG. 3B, a semiconductor device structure 300 is substantially formed, in accordance with some embodiments. The nitride layers 120N, 118N, and 110N and the metal nitride layers 122N and 124N prevent the etchants from diffusing to and damaging the gate electrode structure 124a and the work function metal layer 122 during the formation of the contact openings 132, the contact structures 170a, and the DSL layer 150, in accordance with some embodiments. Therefore, the yield of the semiconductor device structure 300 is improved, in accordance with some embodiments.

Figure 4A:
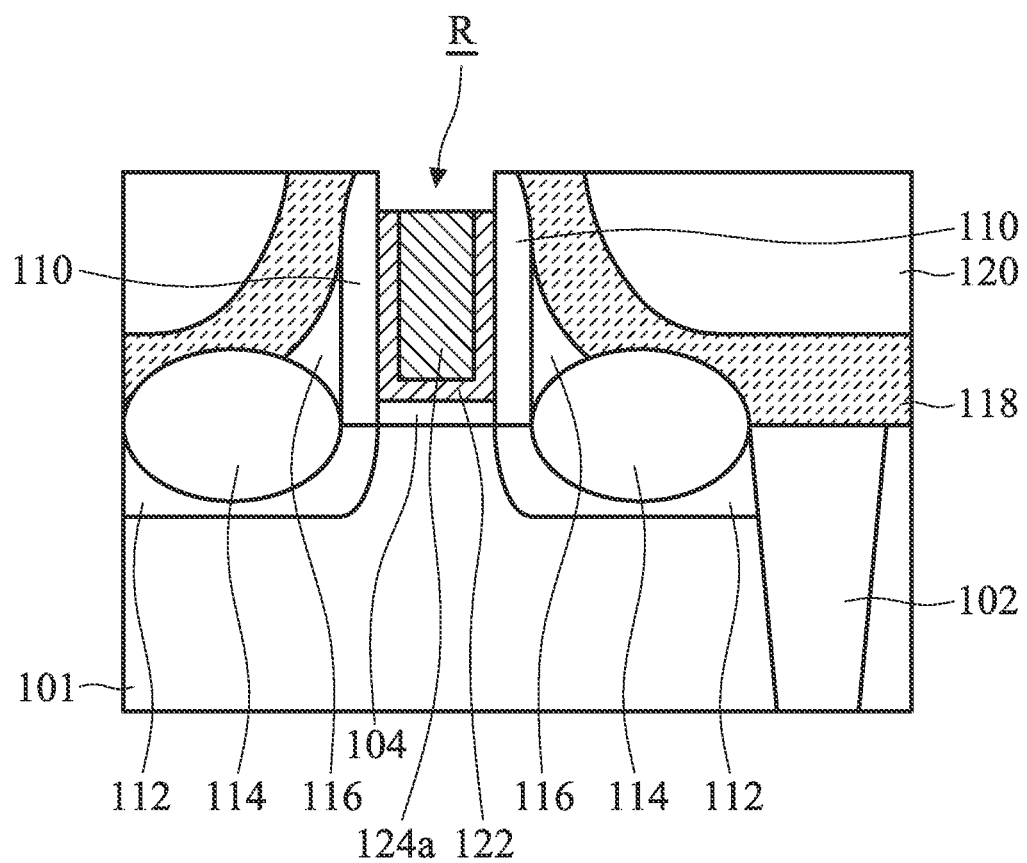
FIGS. 4A-4C are cross-sectional views of various stages of a process for forming a semiconductor device structure, in accordance with some embodiments.
Figure 4B:
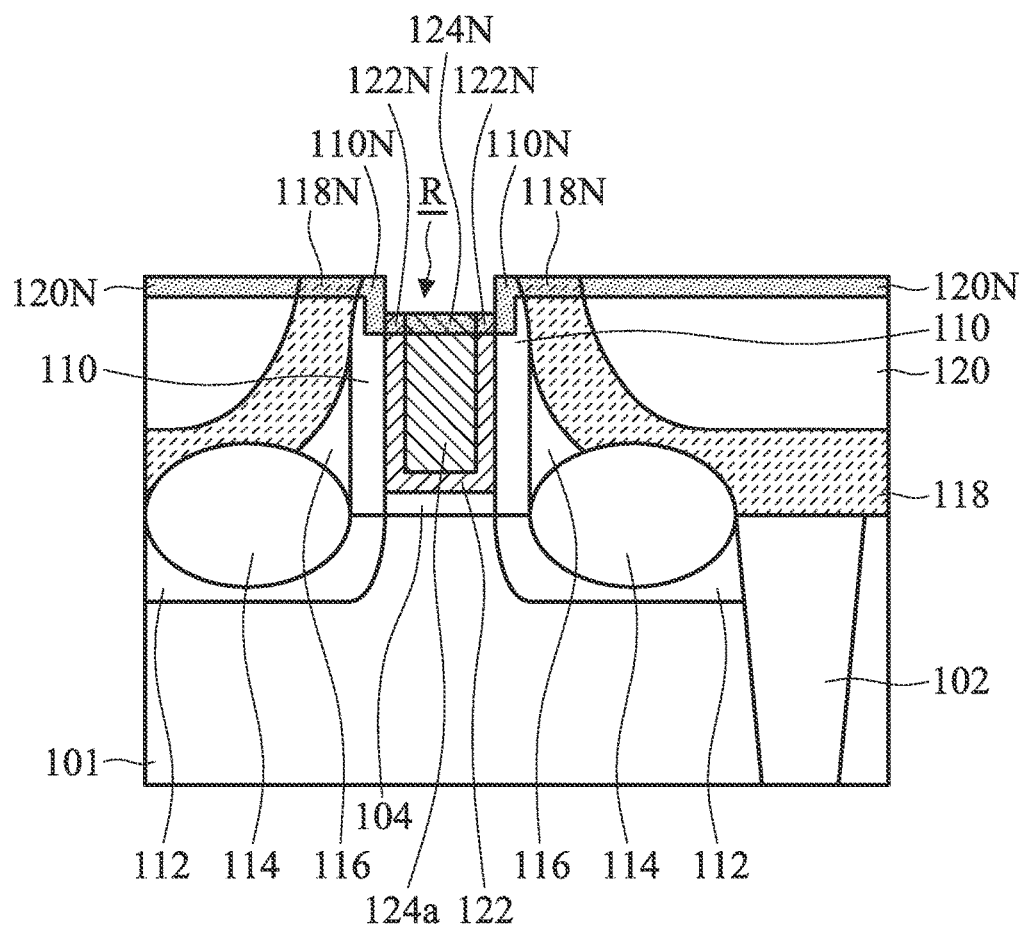
Figure 4C:
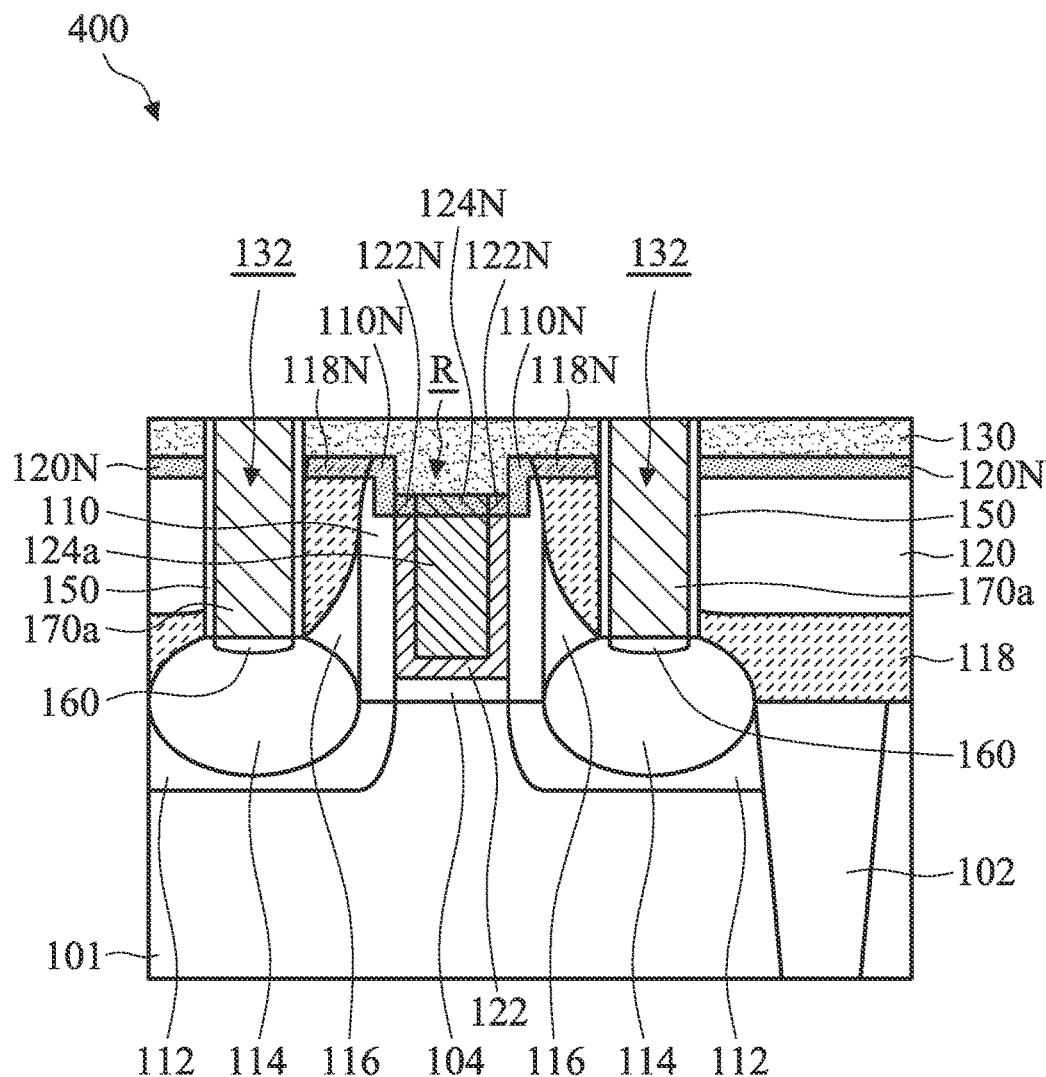

FIGS. 4A-4C are cross-sectional views of various stages of a process for forming a semiconductor device structure 400, in accordance with some embodiments. As shown in FIG. 4A, after the step of FIG. 1D, top portions of the gate electrode structure 124a and the work function metal layer 122 are removed, in accordance with some embodiments. After the removal process, a recess R surrounded by the insulating layer 120 (or the spacer layer 110) and the gate electrode structure 124a is formed, in accordance with some embodiments.

As shown in FIG. 4B, a nitrification process is performed on top portions of the insulating layer 120, the contact etch stop layer 118, the spacer layer 110, the work function metal layer 122, and the gate electrode structure 124a, in accordance with some embodiments. After the nitrification process, metal nitride layers 122N and 124N and the nitride layers 110N, 118N, and 120N are formed over the work function metal layer 122, the gate electrode structure 124a, the spacer layer 110, the contact etch stop layer 118, and the insulating layer 120, respectively, in accordance with some embodiments.

The metal nitride layers 122N and 124N and the nitride layers 110N, 118N, and 120N are formed from the work function metal layer 122, the gate electrode structure 124a, the spacer layer 110, the contact etch stop layer 118, and the insulating layer 120, respectively, in accordance with some embodiments.

After the steps illustrated in FIGS. 1F-1K, as shown in FIG. 4C, a semiconductor device structure 400 is substantially formed, in accordance with some embodiments. In some embodiments, a portion of the etch stop layer 130 is filled in the recess R. The formation of the recess R is able to increase the length of the diffusion path of the etchants from the processes for forming the contact openings 132 and the DSL layer 150, in accordance with some embodiments. Therefore, the formation of the recess R prevents the etchants from diffusing to and damaging the gate electrode structure 124a and the work function metal layer 122, in accordance with some embodiments.

The nitride layers 120N, 118N, and 110N and the metal nitride layers 122N and 124N prevent the etchants from diffusing to and damaging the gate electrode structure 124a and the work function metal layer 122 during the formation of the contact openings 132, the contact structures 170a, and the DSL layer 150, in accordance with some embodiments. Therefore, the yield of the semiconductor device structure 400 is improved, in accordance with some embodiments.

In accordance with some embodiments, semiconductor device structures and methods for forming the same are provided. The methods (for forming the semiconductor device structure) form a metal nitride layer over a top surface of a metal gate electrode structure. The metal nitride layer prevents etchants (coming from the processes for forming contact openings) from diffusing to and damaging the gate electrode structure. Therefore, the yield of the semiconductor device structure is improved.

In accordance with some embodiments, a semiconductor device structure is provided. The semiconductor device structure includes a semiconductor substrate. The semiconductor device structure includes a metal gate electrode structure over the semiconductor substrate. The semiconductor device structure includes an insulating layer over the semiconductor substrate and surrounding the metal gate electrode structure. The semiconductor device structure includes a first metal nitride layer over a first top surface of the metal gate electrode structure and in direct contact with the metal gate electrode structure. The first metal nitride layer includes a nitride material of the metal gate electrode structure.

In accordance with some embodiments, a semiconductor device structure is provided. The semiconductor device structure includes a semiconductor substrate. The semiconductor device structure includes a metal gate electrode structure over the semiconductor substrate. The semiconductor device structure includes an insulating layer over the semiconductor substrate and surrounding the metal gate electrode structure. The insulating layer exposes a first portion of a sidewall of the metal gate electrode structure. The semiconductor device structure includes a metal nitride layer over a first top surface of the metal gate electrode structure and in direct contact with the metal gate electrode structure. The metal nitride layer includes a nitride material of the metal gate electrode structure.

In accordance with some embodiments, a method for forming a semiconductor device structure is provided. The method includes forming a metal gate electrode structure and an insulating layer over the semiconductor substrate. The insulating layer surrounds the metal gate electrode structure. The method includes nitrifying a first top portion of the metal gate electrode structure to form a metal nitride layer over the metal gate electrode structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a metal gate electrode structure and an insulating layer over a semiconductor substrate, wherein the insulating layer surrounds the metal gate electrode structure; and
    nitrifying a first top portion of the metal gate electrode structure to transform the first top portion into a metal nitride layer while nitrifying a second top portion of the insulating layer to transform the second top portion of the insulating layer to a dielectric nitride layer.

2. The method for forming a semiconductor device structure as claimed in claim 1, wherein the nitrification of the first top portion and the second top portion comprises:
    performing a nitrogen plasma process or a nitrogen ion implantation process.

3. The method for forming a semiconductor device structure as claimed in claim 2, wherein the nitrification further comprises:
    after the nitrogen plasma process or the nitrogen ion implantation process, performing a thermal process.

4. The method for forming a semiconductor device structure as claimed in claim 1, further comprising:
    before the nitrification of the first top portion and the second top portion, removing a third top portion of the insulating layer to expose an upper portion of a sidewall of the metal gate electrode structure, wherein the exposed upper portion of the sidewall is a work function metal.

5. The method for forming a semiconductor device structure as claimed in claim 1, further comprising:
    recessing the metal gate electrode structure before the nitrification;
    wherein the recessing includes exposing a sidewall of a spacer element abutting the metal gate electrode.

6. The method of claim 1, where the metal gate electrode has a first composition having a first upper surface prior to the nitrifying and wherein after the nitrifying the first composition has a second upper surface lower than the first upper surface, the second upper surface interfacing the metal nitride layer.

7. The method of forming a semiconductor device structure as claimed in claim 1, further comprising:
    depositing an etch stop layer over the metal nitride layer.

8. The method of forming a semiconductor device structure as claimed in claim 7, further comprising:
    etching the etch stop layer to form contact openings.

9. The method of forming a semiconductor device structure as claimed in claim 8, wherein the contact openings extend through nitrified second top portion of the insulating layer.

10. A method of fabricating a semiconductor device structure, comprising:
forming a metal gate structure over a semiconductor substrate, wherein the forming the metal gate structure includes forming a first conductive layer and a second conductive layer;
disposing an insulating layer over the semiconductor substrate and surrounding the metal gate structure; and
performing a nitrification process on the metal gate structure, wherein the nitrification process introduces nitrogen into an upper portion of the metal gate structure such that the nitrogen combines with a first composition to form a first metal nitride layer over a top surface of the first conductive layer of the first composition and the nitrogen combines with a second composition of the upper portion of the metal gate structure to form a second metal nitride layer over a top surface of the second conductive layer of the second composition, wherein the first composition is different than the second composition.

11. The method of claim 10 wherein the nitrification process forms a nitride layer over the insulating layer by the nitrogen of the nitrification process combining with a dielectric composition of the insulating layer, wherein the nitride layer is a nitride material of the dielectric composition of the insulating layer.

12. The method of claim 10, wherein the forming the metal gate structure includes:
removing a dummy gate to form an opening in the insulating layer;
depositing the first conductive layer lining sidewalls and a bottom of the opening; and
depositing the second conductive layer over the first conductive layer.

13. The method of claim 12, wherein the first conductive layer is a work function metal layer having the first composition of one of a n-type or a p-type work function material.

14. The method of claim 13, wherein the second composition of the second conductive layer includes at least one of aluminum, tungsten, gold, platinum, or cobalt.

15. The method of claim 10, further comprising: recessing the metal gate structure before performing the nitrification process.

16. The method of claim 10, further comprising: recessing the insulating layer before performing the nitrification process to expose a sidewall of at least one of the first conductive layer or the second conductive layer of the metal gate structure.

17. A method for forming a semiconductor device structure, comprising:
forming a metal gate structure and an insulating layer over a semiconductor substrate, wherein the insulating layer surrounds the metal gate structure;
removing a top portion of the insulating layer to expose a portion of sidewalls of the metal gate structure; and
nitrifying a first top portion of the metal gate structure to implant nitrogen into the first top portion of the metal gate structure converting the first top portion to a metal nitride layer wherein the implanting the nitrogen includes converting the exposed portion of the sidewalls of the metal gate structure to the metal nitride layer.

18. The method of claim 17, wherein the removing the top portion of the insulating layer includes removing portions of a spacer layer.

19. The method of claim 17, wherein the nitrifying the portion of the sidewalls of the metal gate structure includes nitrifying a work function metal layer to form the metal nitride layer.

20. The method of claim 17, wherein the nitrifying further includes nitrifying a top surface of the insulating layer.

* * * * *